(12) United States Patent
Chen et al.

(10) Patent No.: US 10,603,916 B2
(45) Date of Patent: *Mar. 31, 2020

(54) METHOD OF MAKING A FLUID STRUCTURE HAVING COMPRESSION MOLDED FLUID CHANNEL

(71) Applicant: HEWLETT-PACKARD DEVELOPMENT COMPANY, L.P., Houston, TX (US)

(72) Inventors: Chien-Hua Chen, Corvallis, OR (US); Michael W. Cumbie, Albany, OR (US)

(73) Assignee: HEWLETT-PACKARD DEVELOPMENT COMPANY, L.P., Spring, TX (US)

( * ) Notice: Subject to any disclaimer, the term of this patent is extended or adjusted under 35 U.S.C. 154(b) by 236 days.

This patent is subject to a terminal disclaimer.

(21) Appl. No.: 15/654,084

(22) Filed: Jul. 19, 2017

(65) Prior Publication Data

US 2017/0313079 A1    Nov. 2, 2017

Related U.S. Application Data

(63) Continuation of application No. 14/770,425, filed as application No. PCT/US2013/052512 on Jul. 29, (Continued)

(51) Int. Cl.
*B41J 2/16* (2006.01)
*B41J 2/14* (2006.01)
(Continued)

(52) U.S. Cl.
CPC .......... *B41J 2/1632* (2013.01); *B29C 69/001* (2013.01); *B41J 2/1404* (2013.01);
(Continued)

(58) Field of Classification Search
CPC .............. H05K 3/284; H05K 1/186; H05K 2203/1316; B41J 2/1601; B41J 2/162;
(Continued)

(56) References Cited

U.S. PATENT DOCUMENTS 4,633,274 A    12/1986 Matsuda
4,873,622 A    10/1989 Komuro et al.
(Continued)

FOREIGN PATENT DOCUMENTS

CN    102470672         5/2012
EP       1027991 A2    8/2000
(Continued)

OTHER PUBLICATIONS

Lee, et al.; A Thermal Inkjet Printhead with a Monolithically Fabricated Nozzle Plate & Self-aligned Ink Feed Hole; J of Microelectromechanical Sys vol. 8, No. 3, Sep. 1999.
(Continued)

*Primary Examiner* — Sarang Afzali
*Assistant Examiner* — Ruth G Hidalgo-Hernandez
(74) *Attorney, Agent, or Firm* — HP Inc. Patent Department

(57) ABSTRACT

A method of making a fluid channel in a printhead structure includes positioning a printhead die on a carrier; compression molding the die into a molded printhead structure; compression molding a first segment of a fluid channel into the molded printhead structure simultaneously with compression molding the die; and materially ablating a second segment of the fluid channel to couple the channel with a fluid feed hole in the die.

6 Claims, 8 Drawing Sheets

Related U.S. Application Data 2013, now Pat. No. 9,731,509, which is a continuation-in-part of application No. PCT/US2013/048214, filed on Jun. 27, 2013, and a continuation-in-part of application No. PCT/US2013/033865, filed on Mar. 26, 2013, and a continuation-in-part of application No. PCT/US2013/033046, filed on Mar. 20, 2013, and a continuation-in-part of application No. PCT/US2013/028216, filed on Feb. 28, 2013, and a continuation-in-part of application No. PCT/US2013/028207, filed on Feb. 28, 2013.

(51) Int. Cl.
*B41J 2/155* (2006.01)
*H05K 1/18* (2006.01)
*H05K 3/28* (2006.01)
*H05K 3/32* (2006.01)
*B29C 69/00* (2006.01)
*H05K 3/40* (2006.01)

(52) U.S. Cl.
CPC ......... *B41J 2/14016* (2013.01); *B41J 2/1433* (2013.01); *B41J 2/14145* (2013.01); *B41J 2/14201* (2013.01); *B41J 2/155* (2013.01); *B41J 2/1601* (2013.01); *B41J 2/162* (2013.01); *B41J 2/1603* (2013.01); *B41J 2/1607* (2013.01); *B41J 2/1623* (2013.01); *B41J 2/1628* (2013.01); *B41J 2/1637* (2013.01); *B41J 2/1645* (2013.01); *H05K 1/186* (2013.01); *H05K 3/284* (2013.01); *H05K 3/32* (2013.01); *B41J 2002/14419* (2013.01); *B41J 2002/14491* (2013.01); *B41J 2202/19* (2013.01); *B41J 2202/20* (2013.01); *H05K 3/4007* (2013.01); *H05K 2203/0228* (2013.01); *H05K 2203/1316* (2013.01); *Y10T 29/49401* (2015.01)

(58) Field of Classification Search
CPC ...... B41J 2/1433; B41J 2/1607; B41J 2/1637; B41J 2202/19; Y10T 29/49002; Y10T 29/49401
See application file for complete search history.

(56) References Cited

U.S. PATENT DOCUMENTS

| | | | |
|---|---|---|---|
| 6,179,410 B1 * | 1/2001 | Kishima | B41J 2/14274 347/45 |
| 6,250,738 B1 | 6/2001 | Waller et al. | |
| 6,554,399 B2 | 4/2003 | Wong et al. | |
| 6,866,790 B2 | 3/2005 | Milligan et al. | |
| 7,238,293 B2 | 7/2007 | Donaldson et al. | |
| 7,490,924 B2 | 2/2009 | Haluzak et al. | |
| 7,727,411 B2 | 6/2010 | Yamamuro et al. | |
| 8,091,234 B2 | 1/2012 | Ibe et al. | |
| 8,496,317 B2 | 7/2013 | Ciminelli et al. | |
| 9,731,509 B2 * | 8/2017 | Chen | B41J 2/1637 |
| 2004/0032468 A1 | 2/2004 | Killmeier et al. | |
| 2004/0084404 A1 | 5/2004 | Donaldson | |
| 2005/0024444 A1 | 2/2005 | Conta et al. | |
| 2006/0175726 A1 | 8/2006 | Kachi | |
| 2008/0079781 A1 | 4/2008 | Shim et al. | |
| 2009/0225131 A1 | 9/2009 | Chen et al. | |
| 2010/0271445 A1 | 10/2010 | Sharan et al. | |
| 2011/0037808 A1 | 2/2011 | Ciminelli et al. | |
| 2011/0298868 A1 | 12/2011 | Fielder et al. | |
| 2012/0000595 A1 | 1/2012 | Mase | |
| 2012/0003902 A1 | 1/2012 | Mase | |
| 2012/0019593 A1 | 1/2012 | Scheffelin et al. | |
| 2016/0009085 A1 | 1/2016 | Chen | |

FOREIGN PATENT DOCUMENTS

| | | |
|---|---|---|
| EP | 1095773 | 5/2001 |
| EP | 1908593 | 4/2008 |
| JP | 2006224624 A | 8/2006 |
| JP | 2006315321 | 11/2006 |
| JP | 2006321222 | 11/2006 |
| JP | 2010137460 A | 6/2010 |
| KR | 20120079171 | 7/2012 |
| KR | 102012007917 | 7/2012 |

OTHER PUBLICATIONS

Lee, et al.; A Thermal Inkjet Printhead with a Monolithically Fabricated Nozzle Plate and Self-aligned Ink Feed Hole; Journal of Microelectromechanical Systems; vol. 8, No. 3, Sep. 1999.

* cited by examiner

METHOD OF MAKING A FLUID STRUCTURE HAVING COMPRESSION MOLDED FLUID CHANNEL

CROSS-REFERENCE TO RELATED APPLICATIONS

This application is a continuation of U.S. application Ser. No. 14/770,425, filed Aug. 25, 2015, which is itself a 35 U.S.C. 371 national stage filing of international application S.N. PCT/US2013/052512, filed Jul. 29, 2013, which is itself a continuation-in-part of each of: PCT/US2013/048214, filed Jun. 27, 2013; PCT/US2013/033865, filed Mar. 26, 2013; PCT/US2013/033046, filed Mar. 20, 2013; PCT/US2013/028216, filed Feb. 28, 2013; and PCT/US2013/028207, filed Feb. 28, 2013, each of which is incorporated herein by reference in its entirety.

BACKGROUND

A printhead die in an inkjet pen or print bar includes a plurality of fluid ejection elements on a surface of a silicon substrate. Fluid flows to the ejection elements through a fluid delivery slot formed in the substrate between opposing substrate surfaces. While fluid delivery slots adequately deliver fluid to fluid ejection elements, there are some disadvantages with such slots. From a cost perspective, for example, fluid delivery slots occupy valuable silicon real estate and add significant slot processing costs. In addition, lower printhead die costs are achieved in part through shrinking the die size. A smaller die size results in a tightening of the slot pitch and/or slot width in the silicon substrate. However, shrinking the die and the slot pitch increases the inkjet pen costs associated with integrating the small die into the pen during assembly. From a structural perspective, removing material from the substrate to form an ink delivery slot weakens the printhead die. Thus, when a single printhead die has multiple slots (e.g., to provide different colors in a multicolor printhead die, or to improve print quality and speed in a single color printhead die), the printhead die becomes increasingly fragile with the addition of each slot.

BRIEF DESCRIPTION OF THE DRAWINGS

The present embodiments will now be described, by way of example, with reference to the accompanying drawings, in which.

Throughout the drawings, identical reference numbers designate similar, but not necessarily identical, elements.

DETAILED DESCRIPTION

Overview

Figure 1:
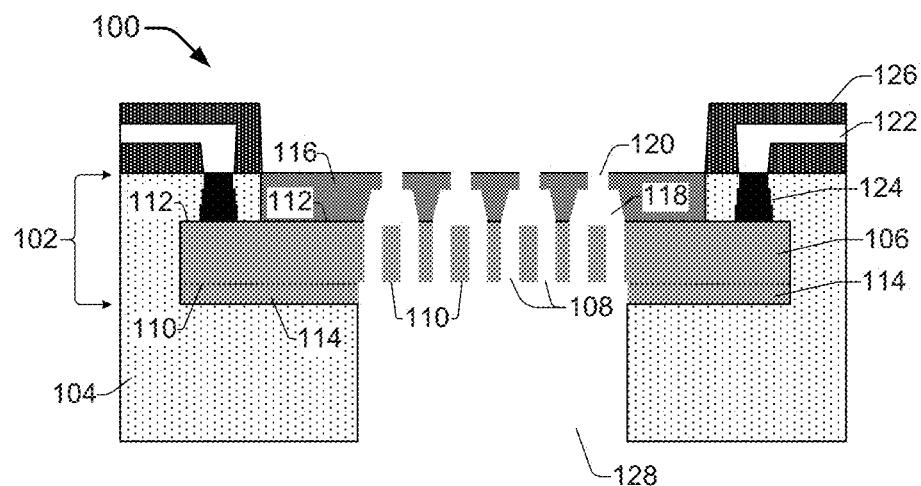
FIG. 1 is an elevation section view illustrating one example of a compression molded fluid flow structure implemented as a printhead structure.

Reducing the cost of conventional inkjet printhead dies has been achieved in the past through shrinking the die size and reducing wafer costs. The die size depends significantly on the pitch of fluid delivery slots that deliver ink from a reservoir on one side of the die to fluid ejection elements on another side of the die. Therefore, prior methods used to shrink the die size have mostly involved reducing the slot pitch and size through a silicon slotting process that can include, for example, laser machining, anisotropic wet etching, dry etching, combinations thereof, and so on. Unfortunately, the silicon slotting process itself adds considerable cost to the printhead die. In addition, successful reductions in slot pitch are increasingly met with diminishing returns, as the costs associated with integrating the shrinking die (resulting from the tighter slot pitch) with an inkjet pen have become excessive.

A compression molded fluid flow structure enables the use of smaller printhead dies and a simplified method of forming fluid delivery channels/slots to deliver ink from a reservoir on one side of a printhead die to fluid ejection elements on another side of the die. The fluid flow structure includes one or more printhead dies compression molded into a monolithic body of plastic, epoxy mold compound, or other moldable material. For example, a print bar implementing the fluid flow structure includes multiple printhead dies molded into an elongated, singular molded body. The molding enables the use of smaller dies by offloading the fluid delivery channels (i.e., the ink delivery slots) from the die to the molded body of the structure. Thus, the molded body effectively grows the size of each die which improves opportunities for making external fluid connections and for attaching the dies to other structures.

At the wafer or panel level, a segment of a fluid delivery channel or slot is formed into the fluid flow structure at the back of each printhead die during a compression molding process in which the die is compression molded into the fluid flow structure. The fluid delivery channel is subsequently completed using a material ablation process, such as powder blasting, that removes remaining channel material and fluidically couples the channel to the printhead die. The compression molding process provides an overall cost reduction when forming fluid delivery channels compared to traditional silicon slotting processes. The first, compression molded segment of the fluid delivery channel formed during the compression molding process, serves as a self-aligning mask that is used in the subsequent material ablation process to complete the channel. The compression molding process enables added flexibility in the molded channel/slot shape, its length, and its sidewall profile, through changes in the topographical design of the top mold chase.

The described fluid flow structure is not limited to print bars or other types of printhead structures for inkjet printing, but may be implemented in other devices and for other fluid flow applications. Thus, in one example, the molded structure includes a micro device embedded in a molding having a channel or other path for fluid to flow directly into or onto the device. The micro device, for example, could be an electronic device, a mechanical device, or a microelectromechanical system (MEMS) device. The fluid flow, for example, could be a cooling fluid flow into or onto the micro device or fluid flow into a printhead die or other fluid dispensing micro device. These and other examples shown in the figures and described below illustrate but do not limit the invention, which is defined in the Claims following this Description.

As used in this document, a "micro device" means a device having one or more exterior dimensions less than or equal to 30 mm; "thin" means a thickness less than or equal to 650 µm; a "sliver" means a thin micro device having a ratio of length to width (L/W) of at least three; a "printhead structure" and a "printhead die" mean that part of an inkjet printer or other inkjet type dispenser that dispenses fluid from one or more openings. A printhead structure includes one or more printhead dies. "Printhead structure" and "printhead die" are not limited to printing with ink and other printing fluids but also include inkjet type dispensing of other fluids for uses other than or in addition to printing.

Illustrative Embodiments

FIG. 1 is an elevation section view illustrating one example of a compression molded fluid flow structure 100 implemented as a printhead structure 100 that is suitable for use in a print bar of an inkjet printer. The printhead structure 100 includes a micro device 102 compression molded into a monolithic body 104 of plastic or other moldable material. A molded body 104 may also be referred to herein as a molding 104. In general, a micro device 102 could be, for example, an electronic device, a mechanical device, or a microelectromechanical system (MEMS) device. In the present printhead structure 100 of FIG. 1, micro device 102 is implemented as a printhead die 102. Printhead die 102 includes a silicon die substrate 106 comprising a thin silicon sliver on the order of 100 microns in thickness. The thin silicon sliver substrate 106 includes fluid feed holes 108 dry etched or otherwise formed therein to enable fluid flow through the substrate 106 from a first exterior surface 110 to a second exterior surface 112. The silicon substrate 106 further includes a silicon cap 114 (i.e., a cap over the silicon substrate 106) adjacent to and covering the first exterior surface 110. The silicon cap 114 is on the order of 30 microns in thickness and can be formed of silicon or some other suitable material such as a polymer layer, a thick metal layer, or a thick dielectric layer. In one implementation, for example, a polymer film can be laminated onto the thin silicon sliver to cover the silicon substrate 106 so an epoxy mold compound will not enter the fluid feed holes 108 during a compression molding process.

Formed on the second exterior surface 112 of substrate 106 are one or more layers 116 that define a fluidic architecture that facilitates the ejection of fluid drops from the printhead structure 100. The fluidic architecture defined by layers 116 generally includes ejection chambers 118 having corresponding orifices 120, a manifold (not shown), and other fluidic channels and structures. The layer(s) 116 can include, for example, a chamber layer formed on the substrate 106 and a separately formed orifice layer over the chamber layer, or, they can include a monolithic layer that combines both the chamber and orifice layers. Layer(s) 116 are typically formed of an SU8 epoxy or some other polyimide material.

In addition to the fluidic architecture defined by layer(s) 116 on silicon substrate 106, the printhead die 102 includes integrated circuitry formed on the substrate 106. Integrated circuitry is formed using thin film layers and other elements not specifically shown in FIG. 1. For example, corresponding with each ejection chamber 118 is a thermal ejector element or a piezoelectric ejector element formed on the second exterior surface 112 of substrate 106. The ejection elements are actuated to eject drops or streams of ink or other printing fluid from chambers 118 through orifices 120.

The printhead structure 100 also includes signal traces or other conductors 122 connected to printhead die 102 through electrical terminals 124 formed on substrate 106. Conductors 122 can be formed on structure 100 in various ways. For example, conductors 122 can be formed in an insulating layer 126 as shown in FIG. 1, using a lamination or deposition process. Insulating layer 126 is typically a polymer material that provides physical support and insulation for conductors 122. In other implementations, conductors 122 can be molded into the molded body 104 as shown below in FIG. 6, for example.

A fluid channel 128 is formed through the molded body 104 and the thin silicon cap 114 to be fluidically coupled with the printhead die substrate 106 at the exterior surface 110. A first segment of the channel 128 is formed during the compression molding process that molds the printhead die 102 into the printhead structure 100. The remainder of the channel 128 is formed through a material ablation process that removes channel material using the first channel segment as a self-aligning mask. The fluid channel 128 provides a pathway through the molded body and thin silicon cap 114 that enables fluid to flow directly onto the silicon substrate 106 at exterior surface 110, and into the silicon substrate 106 through the fluid feed holes 108, and then into chambers 118. As discussed in further detail below, the fluid channel 128 is formed into the molded body 104 in part using a compression molding process that enables the formation of a variety of different channel shapes whose profiles each reflect the inverse shape of whatever mold chase topography is being used during the molding process.

Figure 2:
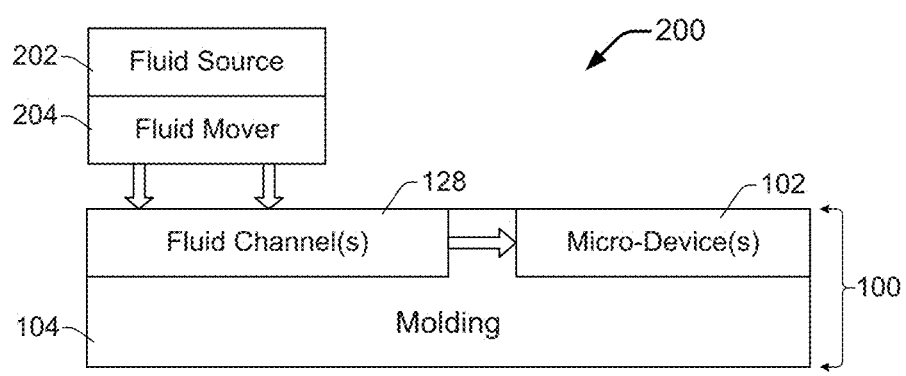
FIG. 2 is a block diagram illustrating an example system implementing a compression molded fluid flow structure such as the printhead structure of FIG. 1.

FIG. 2 is a block diagram illustrating a system 200 implementing a compression molded fluid flow structure 100 such as the printhead structure 100 shown in FIG. 1. System 200 includes a fluid source 202 operatively connected to a fluid mover 204 configured to move fluid to a fluid channel 128 formed in fluid flow structure 100 by compression molding and material ablation processes. A fluid source 202 might include, for example, the atmosphere as a source of air to cool an electronic micro device 102 or a printing fluid supply for a printhead die 102. Fluid mover 204 represents a pump, a fan, gravity or any other suitable mechanism for moving fluid from source 202 to flow structure 100.

Figure 3:
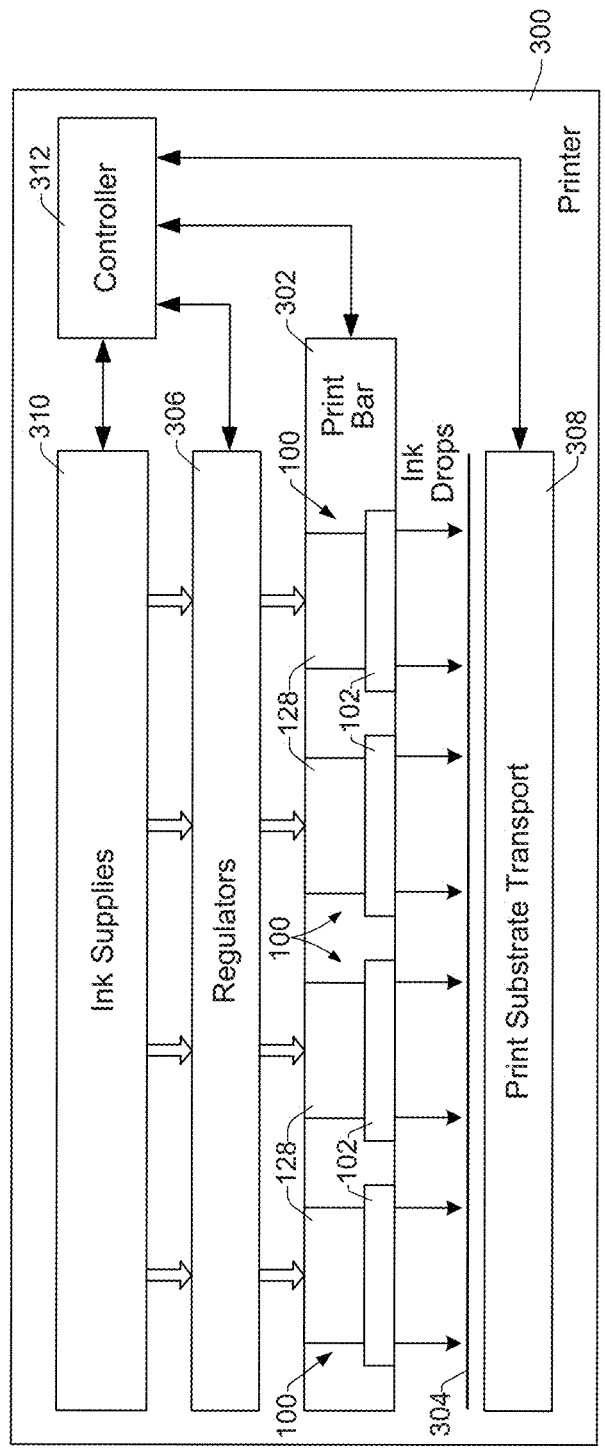
FIG. 3 is a block diagram illustrating an inkjet printer implementing one example of a fluid flow structure in a substrate wide print bar.

FIG. 3 is a block diagram illustrating an inkjet printer 300 implementing one example of a fluid flow structure 100 in a substrate wide print bar 302. Printer 300 includes print bar 302 spanning the width of a print substrate 304, flow regulators 306 associated with print bar 302, a substrate transport mechanism 308, ink or other printing fluid supplies 310, and a printer controller 312. Controller 312 represents the programming, processor(s) and associated memories, and the electronic circuitry and components that control the operative elements of a printer 300. Print bar 302 includes an arrangement of printhead dies 102 for dispensing printing fluid onto a sheet or continuous web of paper or other print substrate 304. Each printhead die 102 receives printing fluid through a flow path that extends from supplies 310 into and through flow regulators 306, and then through compression molded fluid channels 128 within print bar 302.

Figure 4:
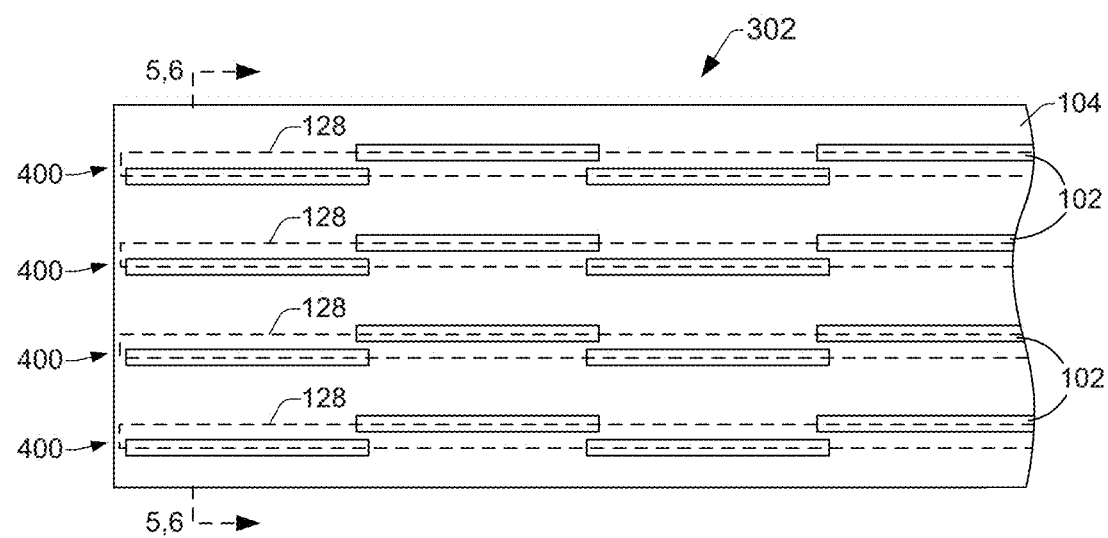
FIGS. 4-6 illustrate an inkjet print bar implementing one example of a compression molded fluid flow structure as a printhead structure suitable for use in a printer.
Figure 5:
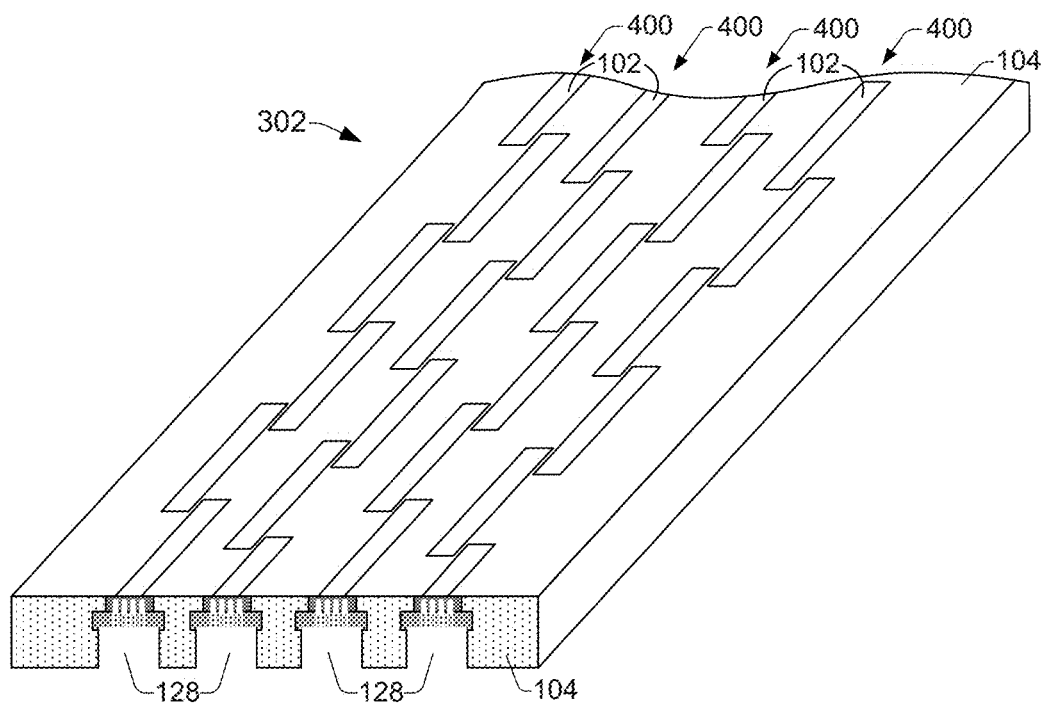
Figure 6:
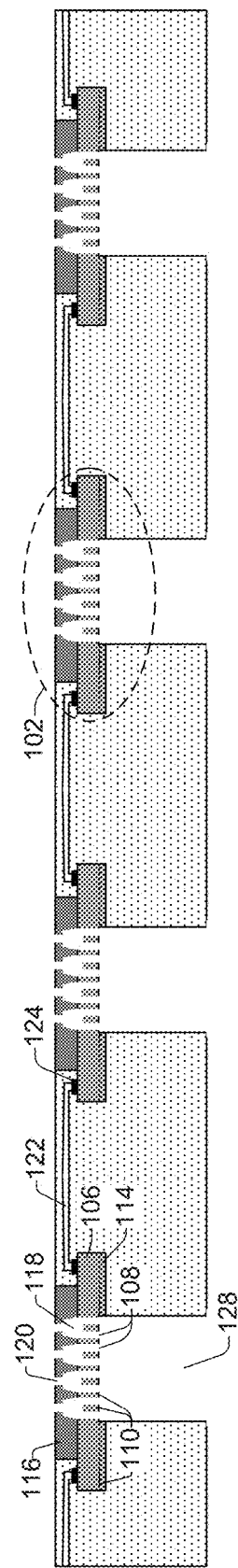

FIGS. 4-6 illustrate an inkjet print bar 302 implementing one example of a compression molded fluid flow structure 100 as a printhead structure 100 suitable for use in printer 300 of FIG. 3. Referring to the plan view of FIG. 4, printhead dies 102 are embedded in an elongated, monolithic molding 104 and arranged generally end to end in rows 400. The printhead dies 102 are arranged in a staggered configuration in which the dies in each row overlap another printhead die in that same row. In this configuration, each row 400 of printhead dies 102 receives printing fluid from a different compression molded fluid channel 128 (illustrated with dashed lines in FIG. 4). Although four fluid channels 128 feeding four rows 400 of staggered printhead dies 102 are shown (e.g., for printing four different colors), other suitable configurations are possible. FIG. 5 illustrates a perspective section view of the inkjet print bar 302 taken along line 5-5 in FIG. 4, and FIG. 6 illustrates a section view of the inkjet print bar 302 also taken along line 5-5 in FIG. 4. The section view of FIG. 6 shows various details of a printhead structure 100 as discussed above regarding FIG. 1.

Figure 7:
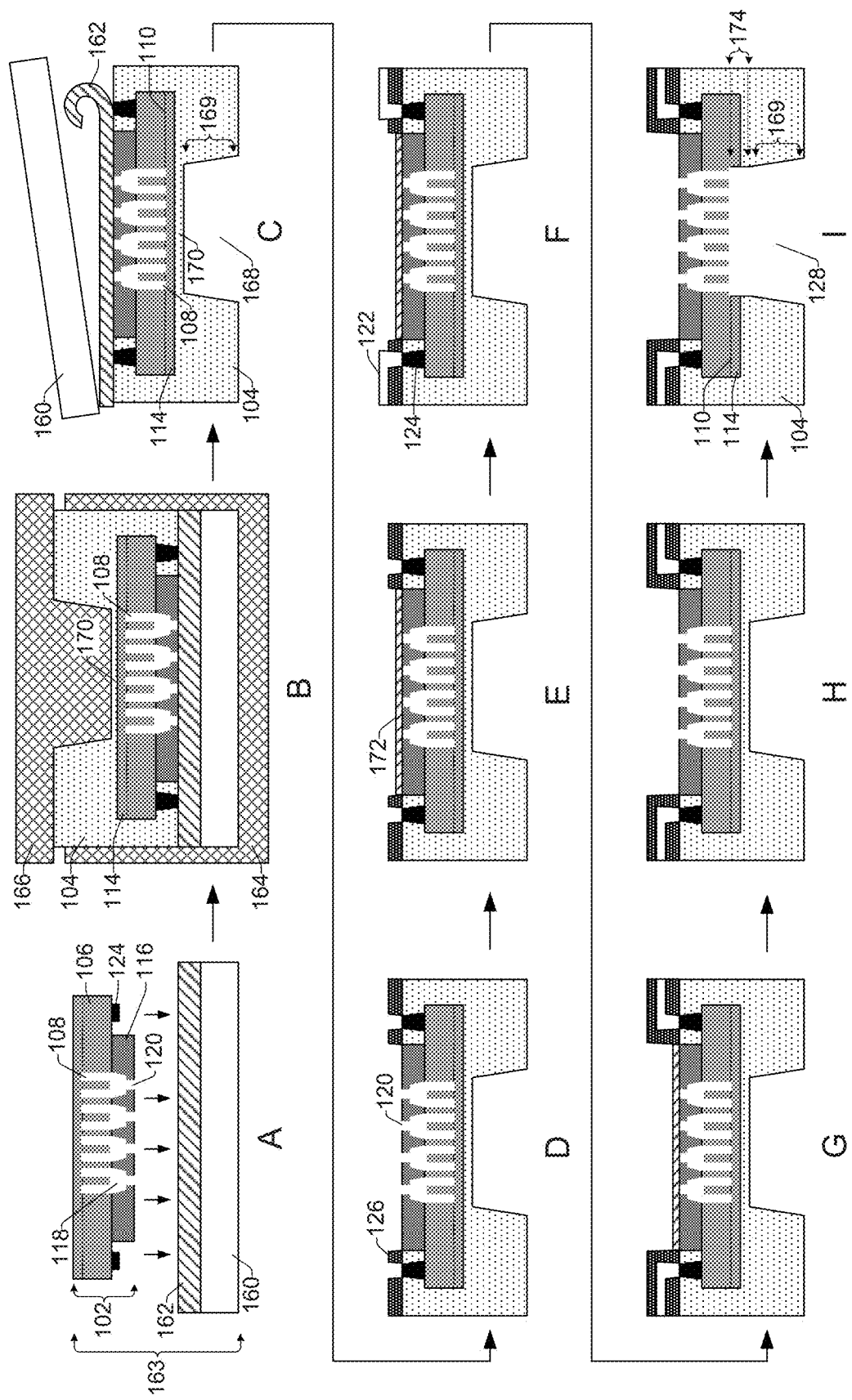
FIGS. 7-10 illustrate an example method for making a compression molded printhead fluid flow structure having a fluid channel formed by processes that include both compression molding and material ablation.

FIGS. 7-10 illustrate an example method for making a compression molded printhead fluid flow structure 100 having a fluid channel 128 formed by processes that include both compression molding and material ablation. FIG. 11 is a flow diagram 1100 of the method illustrated in FIGS. 7-10. As shown in FIG. 7 at part "A", a printhead die 102 is attached to a carrier 160 using a thermal release tape 162 (step 1102 in FIG. 11), forming die carrier assembly 163. The printhead die 102 is placed with the orifice 120 side down onto the carrier 160. The printhead die 102 is in a pre-processed state such that it already includes layer(s) 116 defining fluidic architectures (e.g., ejection chambers 118, orifices 120), and electrical terminals 124 and ejection elements (not shown) formed on the thin sliver substrate 106. Fluid feed holes 108 have also already been dry etched or otherwise formed in the sliver substrate 106.

Referring to FIG. 7 at part "B", the printhead die 102 is compression molded into a molded body 104 (step 1104 in FIG. 11). In general, a compression molding process involves preheating a molding material such as plastic or an epoxy mold compound, and placing the material with the die 102 into a heated mold cavity such as the area inside the bottom mold 164. The mold top 166 is brought down to close the mold, and heat and pressure force the molding material into all the areas within the cavity such that it forms a molding 104 that encapsulates the printhead die 102. In addition to encapsulating the die 102, the molding 104 takes on a shape whose contours follow the topography of the mold top 166. In this example, the molding 104 forms a partial fluid channel 168 that makes up a first, compression molded segment 169 of the fluid channel 128 at the first exterior (backside) surface 110 of substrate 106, as shown at FIG. 7, part "C".

Referring still to FIG. 7, parts "B" and "C", it is apparent that during the compression molding process, the silicon cap 114 prevents molding material from entering into the fluid feed holes 108 in the sliver substrate 106. In addition, the compression molding process leaves a residual layer 170 of molding material over the silicon cap 114. Accordingly, as shown at part "C", the partial fluid channel 168 (first compression molded channel segment 169) does not extend all the way to the ink feed holes 108. Consequently, the fluid channel 128 is subsequently completed in a material ablation process as discussed below. As shown at part "C" of FIG. 7, the die carrier assembly 163 is removed from the bottom and top molds (164, 166), and the carrier 160 is released from the thermal tape 162 and the tape is removed from the die (step 1106 in FIG. 11).

As shown at part "D" of FIG. 7, a polymer insulating layer 126 is laminated onto the orifice 120 side of the printhead die 102, and then patterned and cured (step 1108 in FIG. 11). An SU8 firing chamber protection layer 172 is deposited over the fluidic architecture layer(s) 116, as shown in FIG. 7 at part "E" (step 1110 in FIG. 11). At part "F", as shown in FIG. 7, a metal layer (Cu/Au) is deposited onto the polymer insulating layer 126 and patterned into conductor traces 122 (step 1112 in FIG. 11). A top polymer insulating layer 126 is then spin coated over the conductor traces 122, and then patterned and cured as shown at part "G" of FIG. 7 (step 1114 in FIG. 11). At part "H" of FIG. 7, the firing chamber protect layer 166 is stripped off and a final cure of the polymer insulating layer 126 is performed (step 1116 in FIG. 11). As shown at part "I" of FIG. 7, the residual layer 170 of molding material and the silicon cap 114 are removed over the area of the fluid feed holes 108 in the substrate 106, forming the completed fluid channel 128 (step 1118 in FIG. 11). In one example, a material ablation process is used to remove the residual layer 170 and silicon cap 114. Thus, the completed fluid channel 128 includes a first, compression molded channel segment 169, and a second segment that is a material ablated channel segment 174.

Figure 8:
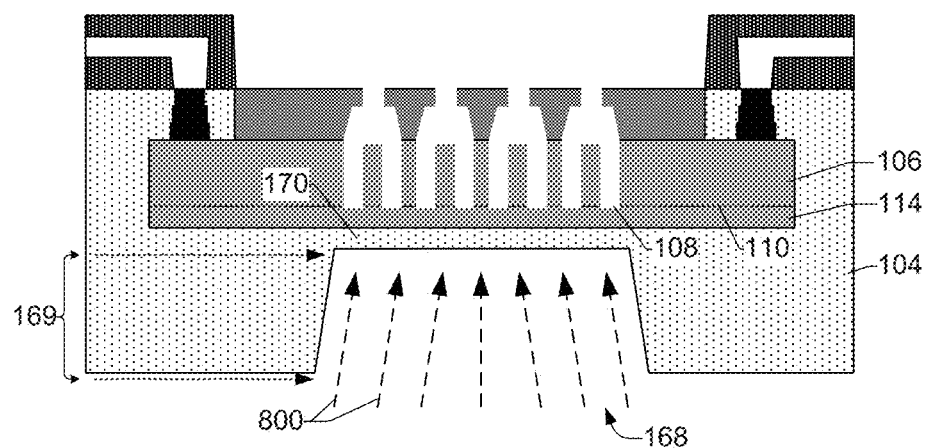
Figure 9:
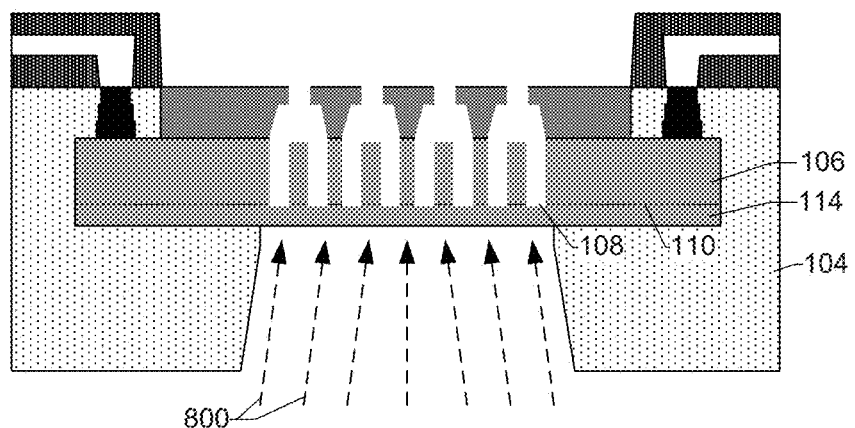
Figure 10:
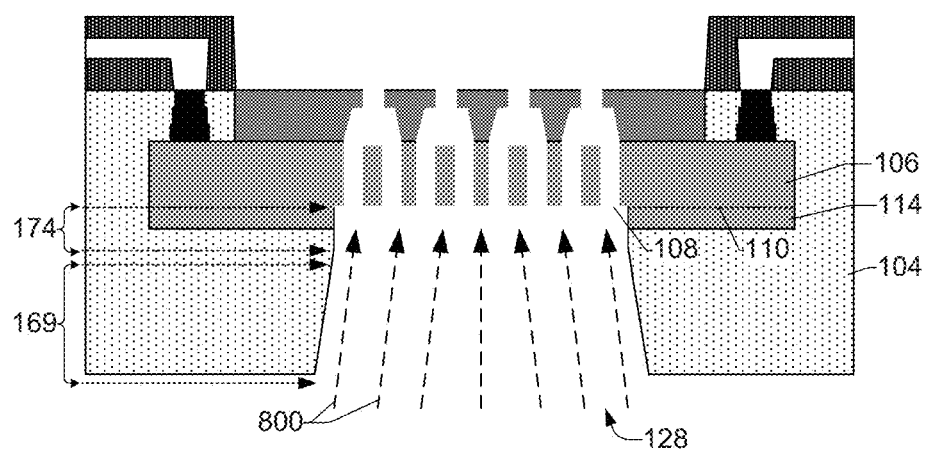
Figure 11:
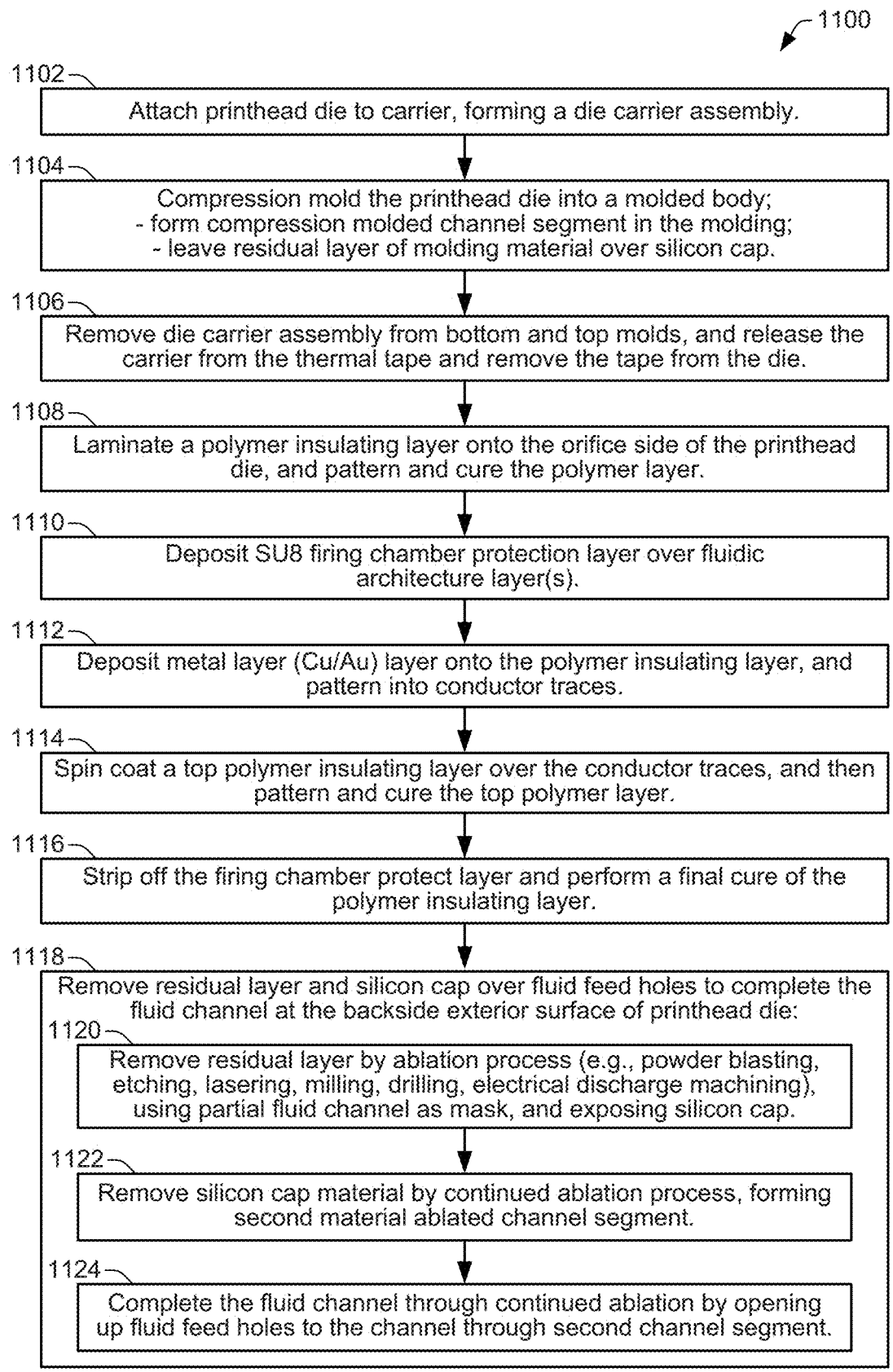
FIG. 11 is a flow diagram of the example method for making a compression molded printhead fluid flow structure illustrated in FIGS. 7-10.

FIGS. 8-10 further illustrate the material removal (ablation) process step shown in part "I" of FIG. 7. There are various processes that can be used to remove material from the silicon cap 114 and the residual layer 170 of molding material that remains over the silicon cap 114. These material ablation processes can include, for example, powder blasting, etching, lasering, milling, drilling, electrical discharge machining, and so on. Such processes often involve the use of a mask that prevents the removal of material in areas where material should not be removed. In the present case the first, compression molded channel segment 169 formed during the compression molding step at parts "B" and "C" of FIG. 7, serves as a self-aligning mask that guides the etchant or other abrasive substance 800 to remove material from the silicon cap 114 and residual layer 170 in areas that extend and complete the channel. The material ablation process forms a second, material ablated channel segment 174 that extends the first channel segment 169, forming the completed fluid channel 128. The completed fluid channel 128 provides a pathway through the molded body and through the thin silicon cap 114, enabling fluid to flow directly onto the silicon substrate 106 at the exterior surface 110, and into the silicon substrate 106 through the fluid feed holes 108, and then into chambers 118.

As shown in FIG. 8, the etchant or other abrasive substance 800 is guided by the first channel segment 169 to remove by ablation, material at the closed end of the channel. The ablation process begins with removing the residual layer 170 of molding material that remains over the silicon cap 114 (step 1120 in FIG. 11). Thus, the material ablation process shown in part "I" of FIG. 7 first removes the residual layer 170 and exposes the silicon cap 114 to the etchant or other abrasive substance 800, as shown in FIG. 9. The material ablation process then proceeds to remove material from the silicon cap 114 (step 1122 in FIG. 11) in the channel area that extends the channel to the exterior surface 110 of the substrate 106. Removing the residual layer 170 and silicon cap material forms a second (material ablated) channel segment 174 that completes the fluid channel 128 and opens up the fluid feed holes 108 to the channel 128 (step 1124 in FIG. 11). Thus, the completed fluid channel 128 comprises a first segment that is a compression molded channel segment 169 and a second segment that is a material ablated channel segment 174.

As can be seen in the figures discussed above, the compression molding process can generate varying shapes within the fluid channel 128. More specifically, FIGS. 1, 5, and 6, illustrate fluid channels 128 that have generally straight sidewalls that are parallel with one another, while FIGS. 7-10 show fluid channels 128 whose sidewalls are straight, but tapered or divergent with respect to one another. Different fluid channel shapes can be generated during the compression molding process by using mold tops 166 that have varying topographical designs. In general, the resulting shape of the fluid channel 128 follows, inversely, the contours of the topography of the mold top 166 used in the compression molding process.

Figure 12:
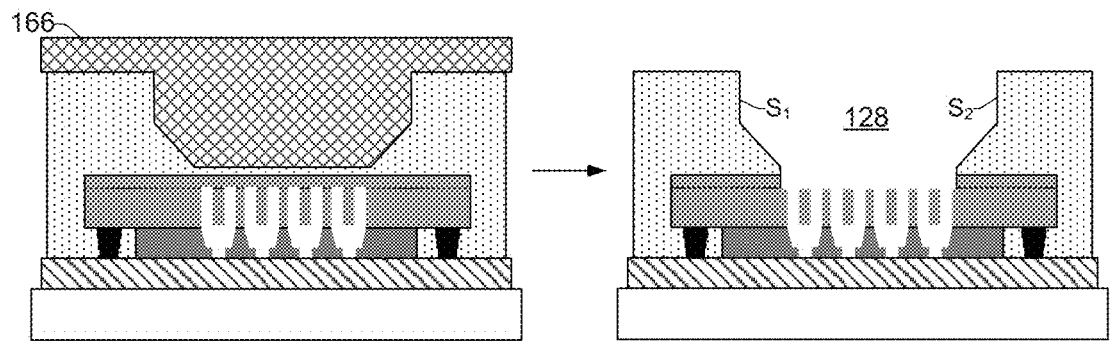
FIGS. 12-14 illustrate examples of mold tops that have varying topographical designs that can be used in a compression molding process to create differently shaped fluid channels.
Figure 13:
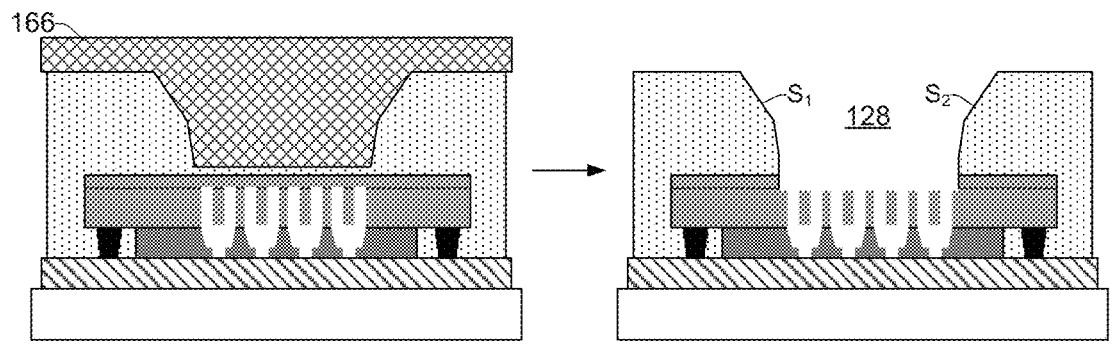
Figure 14:
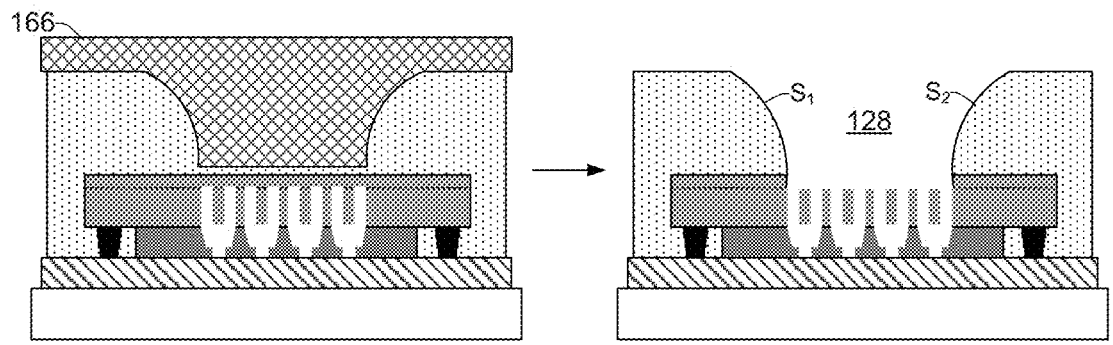

FIGS. 12-14 illustrate several additional examples of mold tops 166 that have varying topographical designs that can be used in a compression molding process to create differently shaped fluid channels 128. As shown in FIG. 12, the mold top 166 has contours that result in a fluid channel 128 with molded sidewalls, S1 and S2, that mirror one another. The sidewalls, S1 and S2, each have two generally straight sections, one section where the sidewalls are parallel with one another and one section where the sidewalls are tapered. In FIG. 13, the mold top 166 contours result in a fluid channel 128 with molded sidewalls, S1 and S2, that each have two sections that are generally straight. Both sections of the sidewalls are tapered, and again, are mirror images as they taper away from each other. As shown in FIG. 14, a mold top 166 can also have curved (or other shaped) contours that generate curved side wall shapes within the fluid channel 128.

In general, the molded fluid channels 128 shown in the figures and discussed above, have channel sidewalls formed in various straight and/or curved configurations that are parallel and/or tapered and/or mirrored to one another. In most cases, it is beneficial to have the channel sidewalls diverge or taper away from one another as they recede or move away from the printhead sliver substrate 106. This divergence provides the benefit of assisting air bubbles to move away from the orifices 120, ejection chambers 118, and fluid feed holes 108, where they may otherwise hinder or prevent the flow of fluid during operation. Accordingly, the fluid channels 128 discussed and shown in the figures comprise side walls that are typically divergent, but that are at least parallel, as they recede from the sliver substrate 106. However, the illustrated channel side wall shapes and configurations are not intended to be a limitation as to other shapes and configurations of side walls within fluid channels 128 that can be formed using a compression molding process. Rather, this disclosure contemplates that other compression molded fluid channels are possible that have side walls shaped in various other configurations not specifically illustrated or discussed.

What is claimed is:

1. A method of making a fluid channel in a printhead structure, comprising:
    positioning a printhead die on a removable die carrier;
    compression molding the die into a molded printhead structure;
    compression molding a first segment of a fluid channel into the molded printhead structure simultaneously with compression molding the die; and
    after removing the die from the removable die carrier, materially ablating a second segment of the fluid channel to couple the channel with a fluid feed hole in the die.

2. A method as in claim 1, wherein the materially ablating comprises removing a residual layer of molding material from between the first segment of the channel and the die.

3. A method as in claim 2, wherein the materially ablating further comprises removing material from a cap on the die to expose the fluid feed hole.

4. A method as in claim 3, wherein removing material from the cap comprises removing a material selected from the group consisting of silicon, polymer, metal, and dielectric.

5. A method as in claim 1, further comprising using the first segment of the channel as a mask during the ablating.

6. A method as in claim 1, wherein materially ablating comprises removing material using a process selected from the group consisting of powder blasting, etching, lasering, milling, drilling, and electrical discharge machining.

* * * * *